United States Patent
Okuchi et al.

(10) Patent No.: US 6,286,524 B1
(45) Date of Patent: Sep. 11, 2001

(54) WAFER DRYING APPARATUS AND METHOD WITH RESIDUAL PARTICLE REMOVABILITY ENHANCEMENT

(75) Inventors: Hisashi Okuchi; Hiroshi Tomita; Soichi Nadahara; Katsuya Okumura, all of Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/257,384

(22) Filed: Feb. 25, 1999

(30) Foreign Application Priority Data

Feb. 27, 1998 (JP) .................................................. 10-048265

(51) Int. Cl.⁷ ....................................................... B08B 7/04
(52) U.S. Cl. .................... 134/95.2; 134/102.3; 134/902; 34/320; 34/326
(58) Field of Search ............................ 34/312, 318, 320, 34/329, 325, 92; 134/21, 26, 151, 102.2, 902, 94.1, 95.1, 95.2, 102.1, 102.3

(56) References Cited

U.S. PATENT DOCUMENTS

| | | | |
|---|---|---|---|
| 5,022,419 | * 6/1991 | Thompson et al. | 134/102 |
| 5,095,927 | * 3/1992 | Thompson et al. | 134/102 |
| 5,169,408 | * 12/1992 | Biggerstaff et al. | 134/144 |
| 5,433,020 | * 7/1995 | Leech, Jr. | 34/92 |
| 5,882,433 | * 3/1999 | Ueno | 134/31 |
| 6,067,727 | * 5/2000 | Muraoka | 34/317 |
| 6,105,592 | * 8/2000 | Thompson et al. | 134/99.2 |

FOREIGN PATENT DOCUMENTS 10-223601    8/1998    (JP) .

* cited by examiner

Primary Examiner—Alexander Markoff
(74) Attorney, Agent, or Firm—Finnegan, Henderson, Farabow, Garrett & Dunner, L.L.P.

(57) ABSTRACT

A wafer dry cleaning method and apparatus capable of eliminating or suppressing adhesion of dust and particles on dried wafer surfaces while minimizing generation of water marks thereon. To achive this, the wafer dryer apparatus is configured including a surface cleaning/drying chamber structure which houses therein a set of spaced-apart silicon wafer workpieces. The dry chamber is operatively associated with a vacuum evacuation device for retaining the interior of this chamber at low pressures required. A water-drain device is provided for forcing water content separated off from the wafer surfaces to drain out of the drying vessel. During such wafer drying process, the wafers may be driven rotating at high speeds to thereby accelerate centrifugal spin-off of residual drops of water on wafer surfaces. Preferably, a chosen purge gas may be fed into the chamber during wafer rotation. The purge gas supply gets started substantially simultaneously upon activation of a vacuum pump for chamber evacuation, or after completion of such vacuum evacuation. In one illustrative embodiment ultra-pure water may be used to rinse the wafers in the chamber.

6 Claims, 8 Drawing Sheets

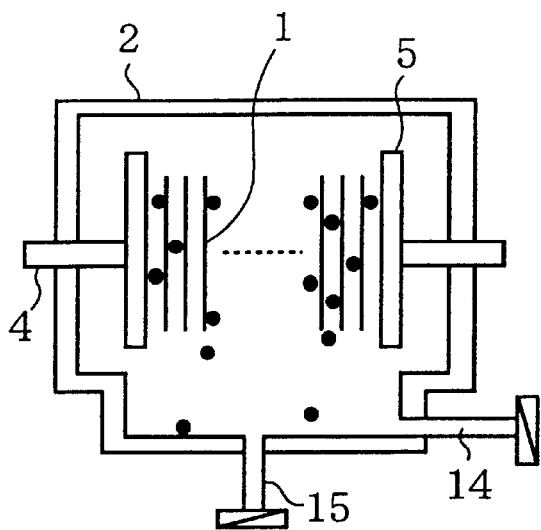
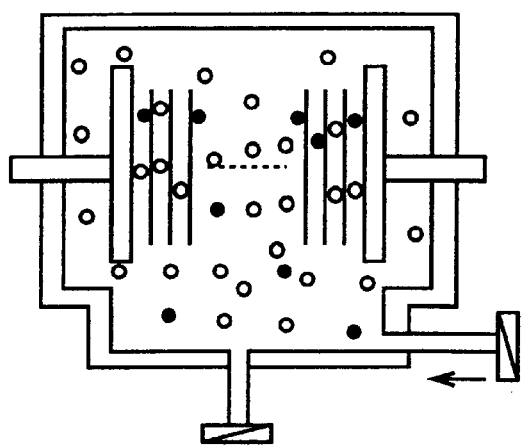
FIG.6A  FIG.6B
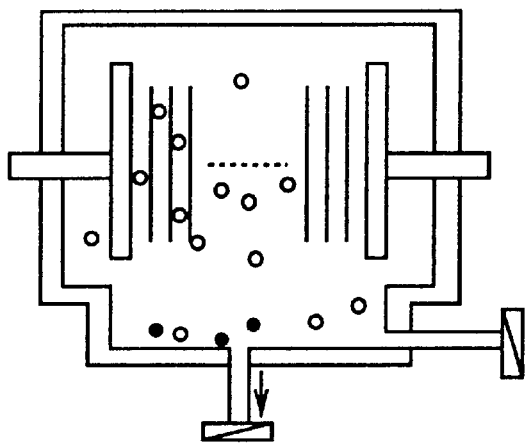
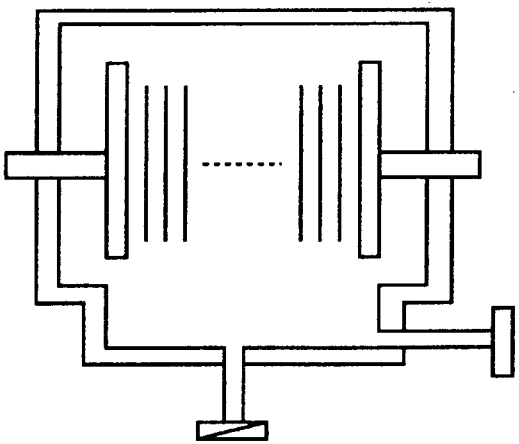
FIG.6C  FIG.6D

WAFER DRYING APPARATUS AND METHOD WITH RESIDUAL PARTICLE REMOVABILITY ENHANCEMENT

BACKGROUND OF THE INVENTION

1. Field of the Invention

The present invention relates generally to wafer cleaning technology and, more particularly, to a method and apparatus for drying semiconductor wafer workpieces under manufacture.

2. Description of Related Art

One typical prior known semiconductor wafer drying apparatus is a rotary drying machine of the batch processing type, which is disclosed in, for example, Published Unexamined Japanese Patent Application ("PUJPA") No. 4-287321.

Use of the rotary wafer dryer of this type permits achievement of dry cleaned wafer surfaces by first mounting to a holder those silicon wafers rinsed by wet clean processes, rotating this wafer holder at high speeds, and then centrifugally spinning off residual water drops from the wafer surfaces.

In the case such prior art wafer dryer is employed, an unwanted pattern of traces of water flow can occur on the resultant surface of a dried wafer. This pattern is commonly referred to as the "water mark" among those skilled in the semiconductor art, which is also called the "water glass" in some cases. Such water mark is created due to the presence of silicon element of the wafer after completion of the wafer dry-clean processing, which silicon element have been dissolved in water drops and then appear through drying the wafer surface.

One example is that water marks are formed on the surface of a silicon wafer after having applied thereto the following processing including the steps of performing chemical processing for the wafer by use of dilute hydrofluoric acid, rinsing the wafer using pure water, and thereafter making the wafer dry to remove residual water drops away from its surface. Especially, in cases where the wafer has an surface configuration including "stair step"-like height differences due to fabrication of on-wafer basic elements and circuit patterns, it is difficult to completely remove water content residing at or near such step-like portions. Obviously, this would result in residence of a large number of water drops, which in turn leads to formation of many "watermark" patterns thereon. Presumably, such water marks are created in the mechanism as will be described below.

Water mark creation require three principal elements: (1) residual water content on silicon waters, (2) dissolved oxygen (DO) in water residues or solute oxygen from the environment or the both, and (3) silicon element dissolved from wafers into the residual water thereon. These elements exhibit chemical reaction within the residual water drops, as represented by:

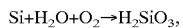

$$Si+H_2O+O_2 \rightarrow H_2SiO_3,$$

which results in production of silicon oxides or equivalents thereto. These silicon oxides remain dissolved in the residual water drops; when water drops attempt to vapor gradually during wafer dry processes, only the silicon oxides reside on the wafer surface letting a water mark appear thereon.

The water mark thus formed might act as an electrically insulative film pattern, which leads to the cause of electrical contact deficiency or failure when fabricating at this location one or more on-wafer semiconductor basic elements such as transistors, resistors, and/or capacitors. This results in a decrease in yield of manufacturing wafers with higher-level functionalities.

In addition, at rotary wafer dry process steps, mist can generate in a way described as follows. During drying of wafers rotating at high speeds, water drops are removed away from the wafer surfaces due to the centrifugal force originated from such high-speed wafer rotation. Some or all of such spin-off water drops collide or impact against the inner walls of a drying machine used, resulting in diffusion of mist-like water in the gases held therearound. This mist can "grow" through aggregation or cohesion with other mist or dust present in the atmosphere. Resultant grown mist often adheres to the wafer surface as particles. These particles can behave to cause on-wafer IC pattern defects at later process steps. In the manufacturing process of highly integrated semiconductor devices, as on-wafer basic elements and IC patterns are becoming smaller in dimension, even "ultrafine" particles that are as small as 0.1 micrometer ($\mu$m) or less in size can cause wafer defects. Additionally, as on-wafer elements and IC patterns are further scaled down in size, the relative step height of "step-like" wafer surface to step distance of the planar wafer surface increases accordingly. This in turn requires that the speed of rotation for water spin-off removal be further increased in order to more successfully eliminate creation of water marks on the wafer surfaces. But there is a trade-off: Making the rotation speed higher can inhibit residence of water content on wafer surfaces, but making it too high can also increase production of mist per se. This will become a serious bar to further development of ultralarge-scale integration (ULSI) technologies in near future.

Another approach to wafer drying as the alternative to rotary drying schemes is to employ low-pressure drying techniques. A typical low-pressure drying method includes the steps of loading into a wafer drying chamber a set of clean wafers rinsed with pure water, and then vacuum-evacuating the interior of this chamber down at low pressures permitting vaporization of residual water content on the wafer surfaces to thereby make the wafer dry in the chamber.

Unfortunately, this approach suffers from incomplete avoidability of particles residing on the wafer surfaces processed. More specifically, when evacuating inside of the chamber for establishment of pressure reduction therein, the internal temperature of the chamber decreases accordingly. When the temperature dropping down to the saturated vapor temperature of residual water content, the residual water begin to boil suddenly. When this happens, secondary boiling or vaporization can simultaneously take place also from the inside of such water residues letting part of water be lifted off in the form of mist during boiling. This mist may grow by aggregating with mists or dusts inherent in the chamber interior. These large resultant mists may adhere to the wafer surfaces and then may act as harmful particles, which might serve to cause on-wafer pattern defects at later process steps. Also note that upon vaporization of water content, the wafer surface temperature decreases due to dispersion of the vaporization heat. When the wafer temperature is at or near a specific level equivalent to the solidifying or freezing point of water (i.e. 0° C.), water should experience both ebullition and solidification at a time. Solidified water is released by liberation to further accelerate unwanted production of mists.

As stated above, prior art wafer drying schemes are associated with problems including creation of water marks on dried wafer surfaces and adhesion of harmful particles and contamination thereto. These problems raise a serious bar to semiconductor device manufacturing processes.

SUMMARY OF THE INVENTION

It is therefore an object of the present invention to provide a method and apparatus for drying semiconductor wafers capable of avoiding the problems faced with the prior art.

It is another object of the present invention to provide an improved wafer drying method and apparatus capable of eliminating, or at least greatly suppressing, generation of water marks on dried wafer surfaces while reducing the risk of adhesion of particles and contamination to wafer surfaces.

To attain the foregoing objects the present invention provides a wafer drying apparatus which includes a drying vessel or chamber structure which houses therein one or more semiconductor wafers. The apparatus also includes a vacuum evacuation device for retaining the interior of the drying chamber in a reduced pressure state. A water-drain device is provided for forcing water content or moisture released from the wafer surfaces to drain out of the chamber.

In accordance with one aspect of the present invention the apparatus may further include a rotator device for rotating the wafers at high speeds. This rotator device has its center of rotation that is substantially identical to the center of gravity of the wafers. The apparatus may have a purge gas supply port for use in supplying a purge gas or gases to inside of the drying chamber. The rotator is capable of accelerating the rotation number of the wafers at an angular acceleration of 1,500 revolution per minute per second (rpm/sec). The drying chamber is capable of holding therein wash water for use in rinsing the wafers.

In accordance with another aspect of the present invention, a wafer drying apparatus is provided including a drying vessel or chamber structure receiving therein one or more semiconductor wafer workpieces. A wafer holder is mounted inside the chamber. This holder is coupled to a rotator device which is operable to rotate this holder within the chamber. A hollow shell-like innerwall member is placed inside the chamber. This "inner jacket" member is between the chamber's inside wall and the wafer holder covering those locations near or around the wafer holder. The chamber has a water drain port for drainage of residual water content adhered to the wafer surfaces. The cylindrical inner jacket has a plurality of openings or holes. A water absorbable sheet may be provided inside the inner jacket cylinder for absorption of water content as released from the wafer. This water absorption sheet may be a wiper made of synthetic fiber or any equivalents thereto.

In accordance with a further aspect of the invention, a wafer drying method includes placing more than one semiconductor wafer workpieces within a drying vessel structure, and evacuating for pressure reduction the drying vessel. The method may also include rotating the wafers. A minimal pressure at the step of evacuating the vessel may be designed ranging from 7 to 300 Torr. The method may further include introducing a chosen purge gas or gases substantially simultaneously upon evacuation of the vessel.

The method may further include, prior to the wafer dry process, dipping these wafers into pure water within the drying vessel, and draining the pure water out of the vessel. The step of rotating the wafer and the step of evacuating the drying vessel get started substantially simultaneously. As appropriate, the method further includes introducing a purge gas or gases substantially simultaneously upon evacuation of the drying vessel. After initiation of rotating the wafers and vessel evacuation, a chosen material is added to inside of the drying vessel. This material may be water soluble, and serve when dissolved in water to reduce the contact angle of water to wafer. Preferably, the material is isopropyl alcohol (IPA). Where appropriate, such water soluble material injection is done after starting of the vessel evacuation for pressure reduction.

These and other objects, features and advantages of the invention will be apparent from the following more particular description of preferred embodiments of the invention, as illustrated in the accompanying drawings.

BRIEF DESCRIPTION OF THE DRAWINGS

FIGS. 6A to 6D illustrate, in cross-section, some of the major process steps of a wafer drying method implementable using a wafer dryer apparatus in accordance with a yet another embodiment of the invention.

DETAILED DESCRIPTION OF THE PREFERRED EMBODIMENT

Figure 1:
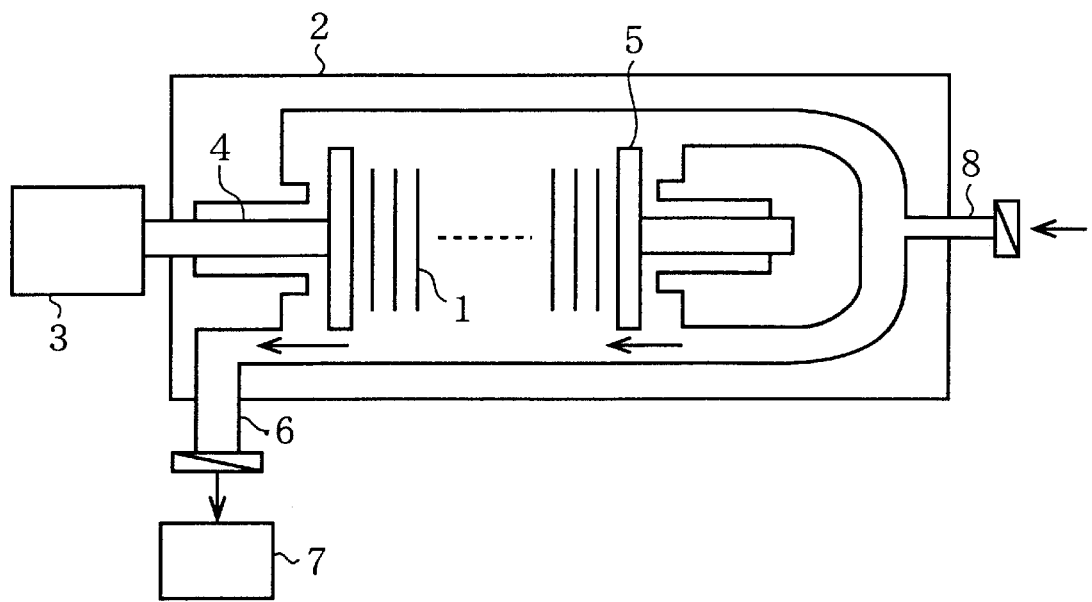
FIG. 1 is a diagram showing a configuration of a wafer drying apparatus in accordance with one preferred embodiment of the present invention.

Referring now to FIG. 1, there is shown a silicon wafer drying apparatus in accordance with one preferred embodiment of the present invention. This wafer drying apparatus shown herein includes a surface drying chamber 2 with a set of silicon wafers 1 as housed therein. The drying chamber 2 is associated with a wafer rotation mechanism which comprises an electrical servo motor 3 and a rotation shaft 4 rotatably coupled thereto. The chamber 2 also includes a wafer holder 5 for stably holding silicon wafers 1. After loading the wafers 1 into the chamber 2 in the state shown in FIG. 1, the rotation mechanism is electrically activated causing the holder 5 mounting the wafers 1 to rotate at high speeds under vacuum to thereby dry the wafers 1.

The wafer drying chamber 2 has a gas-exhaust duct 6 coupled thereto for removal of gases out of the interior of the chamber 2. The duct 6 is in turn coupled to a vacuum pump 7 for vacuum evacuation to reduce pressure in the chamber 2.

The chamber 2 also has a purge-gas inlet duct 8, which is used for introduction of a chosen purge gas letting the interior of the chamber 2 be filled with such gas. The purge gas may typically be a dried nitride gas. During wafer drying processes the duct 8 is opened allowing the purge gas to flow into the chamber 2 in the direction indicated by arrow in FIG. 1 to charge inside of chamber 2.

The chamber 2 is surface-processed on its inner wall surfaces using chemical treatment or fluoride plastic coating, for example, to thereby enable successful removal of water content or "drops" as centrifugally spun off and spread out of the wafer surfaces during high-speed rotation of wafers 1.

The chamber 2 is operatively associated with a pressure sensor (not shown) attached thereto for use in monitoring the pressure within the chamber 2. This "watchdog" sensor is responsive to a change in pressure for generating and issuing a corresponding electrical signal, which is then coupled to an associative control system (not shown) as externally provided including a pressure controller that controls supplement of a purge gas or gases and the gas exhaust amount of vacuum pump 7 to thereby retain the interior space of chamber 2 at a predefined low-pressure level. This in turn makes it possible to well control establishment of the intended gas pressure within the chamber 2 while at the same time continuously introducing the purge gas into the chamber 2.

The rotation force or torque generatable by the servo motor 3 is transmitted via the rotation shaft 4 toward the wafer holder 5 that is directly coupled to the rotation shaft 4, causing the holder 5 to rotate at high speeds. The holder 5 is arranged so that the center of gravity or "centroid" of each of equally spaced wafers 1 is substantially identical to the center of rotation of the holder 5 (i.e. an extension of the center line of the rotation shaft 4) to ensure that the wafers 1 exhibit stable rotation at predefined speeds. Additionally, rendering centroids of plural wafers identical to the rotation center may enable simultaneous rotation of multiple wafers in the chamber 2.

The main shaft rotation drive mechanism module with the rotation shaft 4 received therein is given a gas exhaust and evacuation system that is independent of that for the chamber 2, to thereby enable elimination or suppression of dust generation from the shaft drive module during high-speed rotation thereof.

A silicon wafer drying method by use of the apparatus shown in FIG. 1 is as follows. After having effected wet clean processing and pure water rinse processing, the resulting wafers 1 are transported inside the chamber 2 and then settled therein via its wafer entrance port (not shown). Typically, the wafers are transferred and loaded into chamber 2, in such a way that these are subdivided into groups, each consisting of a predefined number of wafer workpieces, each group being mounted in a cassette which is transferred and loaded into chamber 2 and then settled in the holder 5.

After such plural wafers 1 are set in the holder 5, the wafer inlet port of the chamber 2 is closed. Then, the vacuum pump 7 is activated evacuating the interior of the chamber 2 to provide the reduced pressure environment therein. Upon starting of such vacuum evacuation, the wafers 1 loaded are driven substantially simultaneously to begin rotating at a preselected speed to thereby effectuate low-pressure drying of the wafers 1.

The vacuum evacuation of the chamber 2 is continuously performed until the internal pressure of the chamber 2 drops down to 100 Torr (13.3 kPa). After the chamber pressure reached such target level, control is done to let the chamber 2 retain constantly the last pressure level.

The number of rotation of the wafers 1 held in the holder 5 is determinable and adjustable under the control of the external controller (not shown) operatively associated with the chamber 2—typically, the wafer rotation number is set at 2,000 to 3,000 revolutions per minute (rpm). In the illustrative embodiment the wafer dryer apparatus is capable of increasing or accelerating the wafer rotation number up to approximately 1,500 rpm per second (rpm/sec) while permitting rapid increase or "rise-up" of the rotation number.

After completion of the pressure reduction and wafer rotation, a purge gas is then introduced into the chamber 2 through a purge gas inlet port (not shown) at predefined timing. The purge gas may be dried nitrogen. The purge gas may alternatively be the cleanroom air, or any other suitable gases as long as these are chemically inactive and stable at temperatures in the chamber 2 as well as free from dust and contaminants.

One desirable example of wafer-dry criteria setup is that, immediately after starting the vacuum evacuation for chamber pressure reduction, a dry nitrogen gas is introduced into the interior space of the chamber 2 at the flow rate of 60 liters per minute at the internal pressure of the chamber 2 of 100 Torr and the wafer rotation number of 2,400 rpm. With these environmental settings retained, the wafer dry processing is continued three minutes. After having effected this processing the inside of the chamber 2 is returned at the atmospheric pressure. This may be done by increasing the flow rate of a purge gas used, or alternatively, by additionally introducing leak gases equivalent in nature to the purge gas via a leak valve (not shown). Thereafter, the wafer inlet is opened unloading the holder 5 that mounts thereon the dried wafers 1 for transportation to a succeeding IC wafer manufacturing process module or equipment to proceed further downstream.

With the low-pressure rotary wafer drying scheme described above, it will be expected in most cases that any drops of water residing on the processed wafer surfaces may almost perfectly disperse or centrifugally spin off in outer peripheral directions minimizing or eliminating residual water content on the wafers. This in turn enables formation of no water marks resulting in achievement of ultra-clean dried wafer surfaces.

In some cases, however, a few drops of water can still reside at step-like surface configuration portions on the wafers 1 even where the low-pressure rotary drying is carried out. One example is that adhesion of residual water content can occur, in cases where silicon wafers of interest have circuit patterns fabricated on the surface thereof with increased surface irregularities letting the wafer surface-to-pattern height differences stay significant. This becomes remarkable especially at or near the center of wafer workpiece corresponding in position to the rotation shaft 4 of chamber 2. Fortunately, our experimentation results reveal the fact that appropriate setting of the wafer rotation number and the chamber's inside pressure as well as the purge gas introduction timing could make it possible to further enhance the achievability of acceptable silicon wafers that are free from any water marks.

Figure 2:
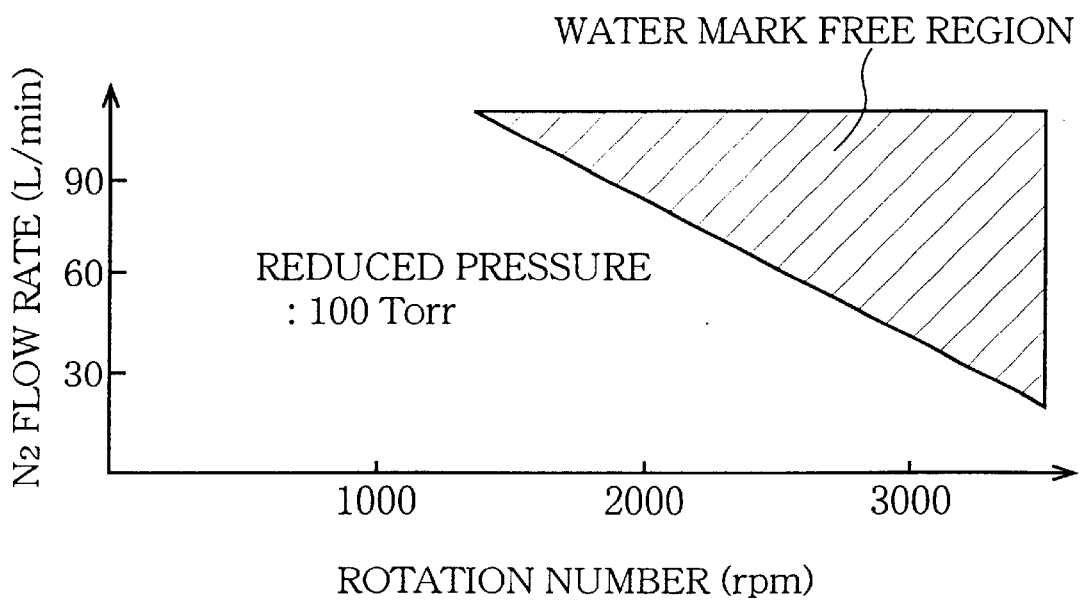
FIG. 2 is a graph demonstrating an extended water mark-free region when changing the number of rotation and the flow rate of a nitrogen gas for use in drying wafers by use of a wafer drying method also embodying this invention.

In FIG. 2, there is demonstrated the setup of preferable conditions (water mark-free region) which guarantee elimination of on-wafer water mark creation, as indicated by a triangle area or zone hatched with parallel oblique strokes, when varying the wafer rotation number and the flow rate of a dry nitrogen purge gas. Here, the chamber's internal pressure was set at 100 Torr. The purge gas was introduced at the same time when the vacuum evacuation for chamber pressure reduction gets started. The volume of chamber 2 was 20 liters. A total number of 25 pieces of pure water-cleaned 8-inch silicon wafers were housed within chamber 2.

It would be readily appreciated by those skilled in the art from the graph of FIG. 2 that the water mark creation suppressibility increases as the purge gas flow rate increases and also as the wafer rotation number increases. Although not specifically indicated in the FIG. 2 graph, our experimentation also suggested that in a chamber pressure range of from 1 Torr (0.13 kPa) to 300 Torr (39 kPa), the lower the chamber pressure, the less the water marks.

Figure 3:
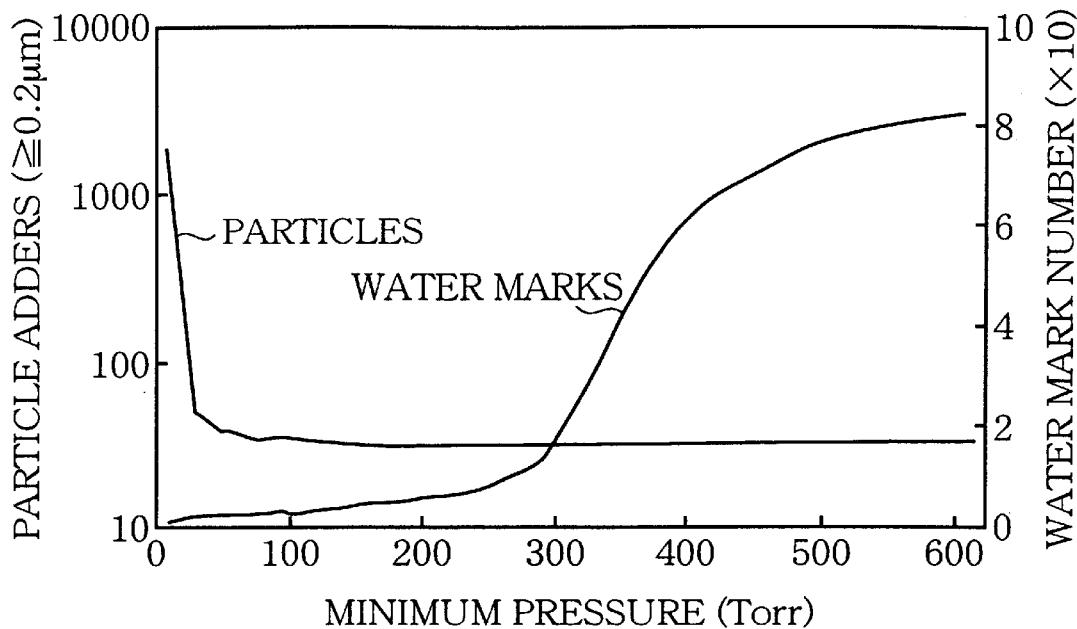
FIG. 3 is a graph showing how the number of water marks and the particle number vary with a change in target vacuum pressure.

FIG. 3 shows a relation of observable water marks versus the internal pressure (minimal pressure) of the chamber 2 along with a relation of the number of particle adders and the chamber pressure. Here, the number of particle adders mean the difference of number of particles before and after cleaning and drying treatment, using cleaned patterned wafer.

It is noted here that the wafer rotation number was fixed at 3000 rpm, and that the flow rate of a dried nitrogen purge gas was at 60 l/min. Introduction of such purge gas was started simultaneously upon starting of vacuum evacuation for chamber pressure reduction. The volume of chamber 2 was 20 liters. A total number of 25 pieces of pure water-cleaned 8-inch silicon wafers were loaded in chamber 2.

Figure 10:
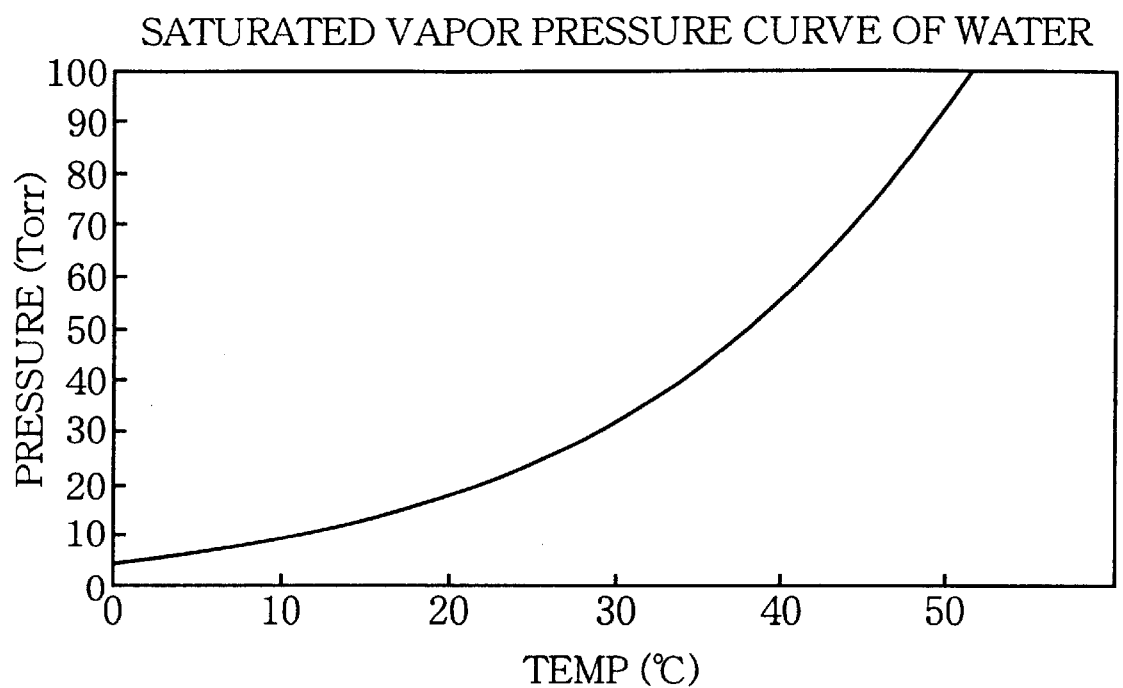
FIG. 10 is a graph showing a saturated vapor pressure curve of water obtainable in the embodiment apparatus.

As readily seen from the graph of FIG. 3, the resulting observable water marks on the wafer surfaces rapidly increase in number in a region beyond a specific "boundary" chamber pressure level of about 300 Torr. In regard to the particle number, this tends to rapidly decrease with a specific chamber pressure level of 20 Torr, or more or less, being as the boundary. Such particle number increase comes from the reason stated above—that is, because of the fact that, at low pressures, less than or equal to 20 Torr, residual water drops on wafer surfaces exhibit sudden boiling thus generating fog or mist therearound, which in turn adheres to the wafer surfaces. To suppress or minimize such rapid increase in particle number, it will be recommendable that the lower limit of the chamber's internal pressure be set equal to the saturated vapor pressure of water at a temperature of 0° C. (at 7 Torr or therearound) as readily determinable from the water vapor pressure curve as shown in FIG. 10. More preferably, the chamber pressure should be at 20 Torr by taking account of any possible deviation in chamber pressure when practical implementation of the principles of the present invention. Retaining the chamber pressure lower limit in this way makes it possible to successfully eliminate, or at least greatly reduce, such rapid increase in particle number.

The experimental results presented in FIGS. 2–3 encourage us to believe that carefully controlling the chamber's internal pressure (minimal pressure) during wafer dry cleaning processes to stay within a limited range of from 7 to 300 Torr enables reduction of both the number of water marks occurrable on silicon wafer surfaces and the number of residual particles thereon.

Figure 4:
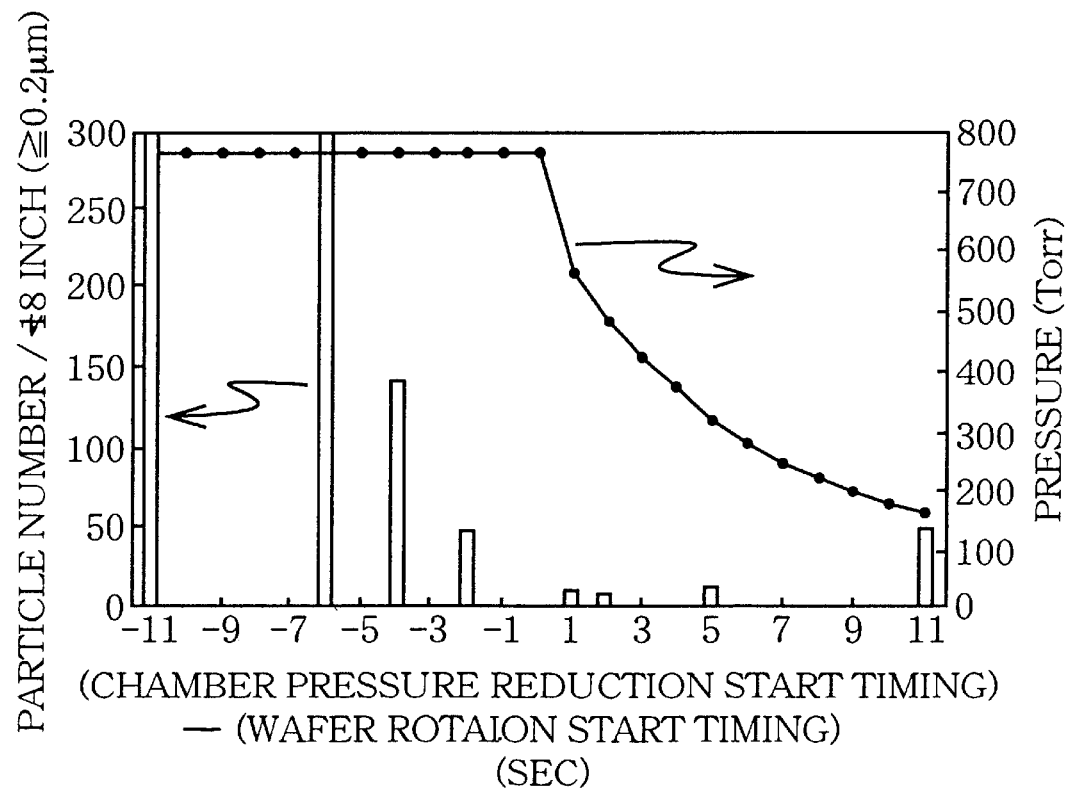
FIG. 4 is a graph showing a relation of the particle number versus a time difference between the pressure reduction start timing and wafer rotation start timing.

FIG. 4 is a graph showing how residual particles on dried silicon wafer surfaces vary in number with a change in wafer rotation start-up timing relative to the chamber pressure reduction vacuum evacuation startup timing.

Note here that the wafer rotation number was fixed at 3000 rpm, and that the flow rate of a dry nitrogen purge gas was at 60 l/min, whereas the target minimum pressure was 100 Torr. The purge gas was introduced into chamber 2 simultaneously upon starting of vacuum evacuation for pressure reduction. The volume of chamber 2 was 20 liters.

A total number of 25 pieces of pure water-cleaning completed 8-inch silicon wafers were housed within chamber 2.

In the FIG. 4 graph, the on-wafer residual particle number was measured while letting the wafer rotation start timing relative to the vacuum evacuation start timing (chamber pressure reduction start timing) vary once per second into eight different criteria, the results of which are graphically visualized in a bar chart fashion. This graph also presents a change in chamber's internal pressure at the beginning of wafer rotation in a folded-line chart style.

The experimental results shown in FIG. 4 suggest that, in the case the wafer rotation has been started prior to startup of vacuum evacuation for chamber pressure reduction, a relatively large number of particles reside on the wafer surfaces, whereas this particle number was reduced when the wafer rotation gets started at least simultaneously upon starting of the pressure reduction or after the same. The FIG. 4 graph also tells that the particle number tends to slightly increase as the wafer rotation start timing is delayed from the pressure reduction start timing point.

Consequently, it has been affirmed that the intended reducibility of residual particle number is achievable by letting the wafer rotation get started simultaneously upon the vacuum evacuation for chamber pressure reduction, or alternatively by letting the former start after the latter, although the simultaneous rotation/evacuation startup scheme is more preferable to accomplish minimization of the particle number.

A silicon wafer drying method in accordance with another embodiment of the present invention will be described hereafter, which method may also be implemented by use of the wafer dryer apparatus shown in FIG. 1. Principally, this embodiment method is similar to the aforementioned method except for the fact that no purge gases are introduced into the chamber 2 during drying of silicon wafers under manufacture.

More specifically, multiple silicon wafers 1, settled inside the dry cleaning chamber 2 shown in FIG. 1, are subject to the "low-pressure rotary drying" processing while these wafers are driven to begin rotating substantially simultaneously upon starting of vacuum evacuation of the interior of chamber 2 in a way similar to that of the prior described embodiment. Chamber 2 undergoes vacuum evacuation so that its inside pressure drops down at 30 Torr or below, by way of example. Once after reaching the target pressure level, the last reached pressure is retained constantly in chamber 2. Wafers 1 are rotated at high speeds, typically ranging from 2,000 to 3,000 rpm. In this state the intended processing is done three minutes. Thereafter, the chamber's inside space is subject to leaking thereby letting it return at or near the atmospheric pressure. Then, the wafers processed are unloaded from chamber 2.

With such methodology also embodying the present invention, it is possible to eliminate or suppress creation of unwanted water marks on the dried wafer surfaces, which may in turn enable achievement of ultraclean wafer surfaces without suffering from the presence of water marks after completion of the drying process.

A wafer drying method in accordance with the third embodiment of the present invention is similar to the second embodiment stated in that it is implementable using the wafer dryer apparatus shown in FIG. 1.

The third embodiment is also similar to the first embodiment in that the wafers 1, loaded in the chamber 2 of FIG. 1, are arranged to experience both the rotation and vacuum evacuation for chamber pressure reduction which are started up at a time with a purge gas introduced into chamber 2 during drying of wafers 1. A significant feature of this embodiment lies in that a few drops of chosen organic solvent are added or injected into chamber 2. The solvent may be isopropyl alcohol (IPA) or any equivalents thereof. Specifically, after having satisfactorily evacuated inside of chamber 2 at low pressures required, a minute amount—typically 1 cc—of IPA solvent is injected into chamber 2. Injection of IPA into the low-pressure or vacuum atmosphere established within chamber 2 serves to accelerate vaporization or evaporation of the IPA solvent used, letting resultant IPA gases diffuse in all directions within chamber 2 so that part of gasses finally reaches the wafer surfaces being processed. The IPA components arrived at wafers then behave to dissolve into certain water drops continuously residing thereon due to hesitation of outward spin-out therefrom, resulting in a decrease in surface tension of such wafer drops. This in turn facilitates or accelerates centrifugal outward dispersion of any residual water drops during rotation of wafers, which water drops have hardly been removed away in the prior art. As a result the wafer drying efficiency is increased, leading to suppressibility of water marks on the wafer surfaces dried.

In this embodiment, wafer surface drying methodology is totally different in concept over prior art IPA vapor drying technologies. The use of a precisely controlled trace amount of IPA solvent may well suppress generation of water marks on resultant wafer surfaces, thus enabling achievement of wafer dry-cleaning processes with increased efficiency and enhanced reliability.

Figure 5:
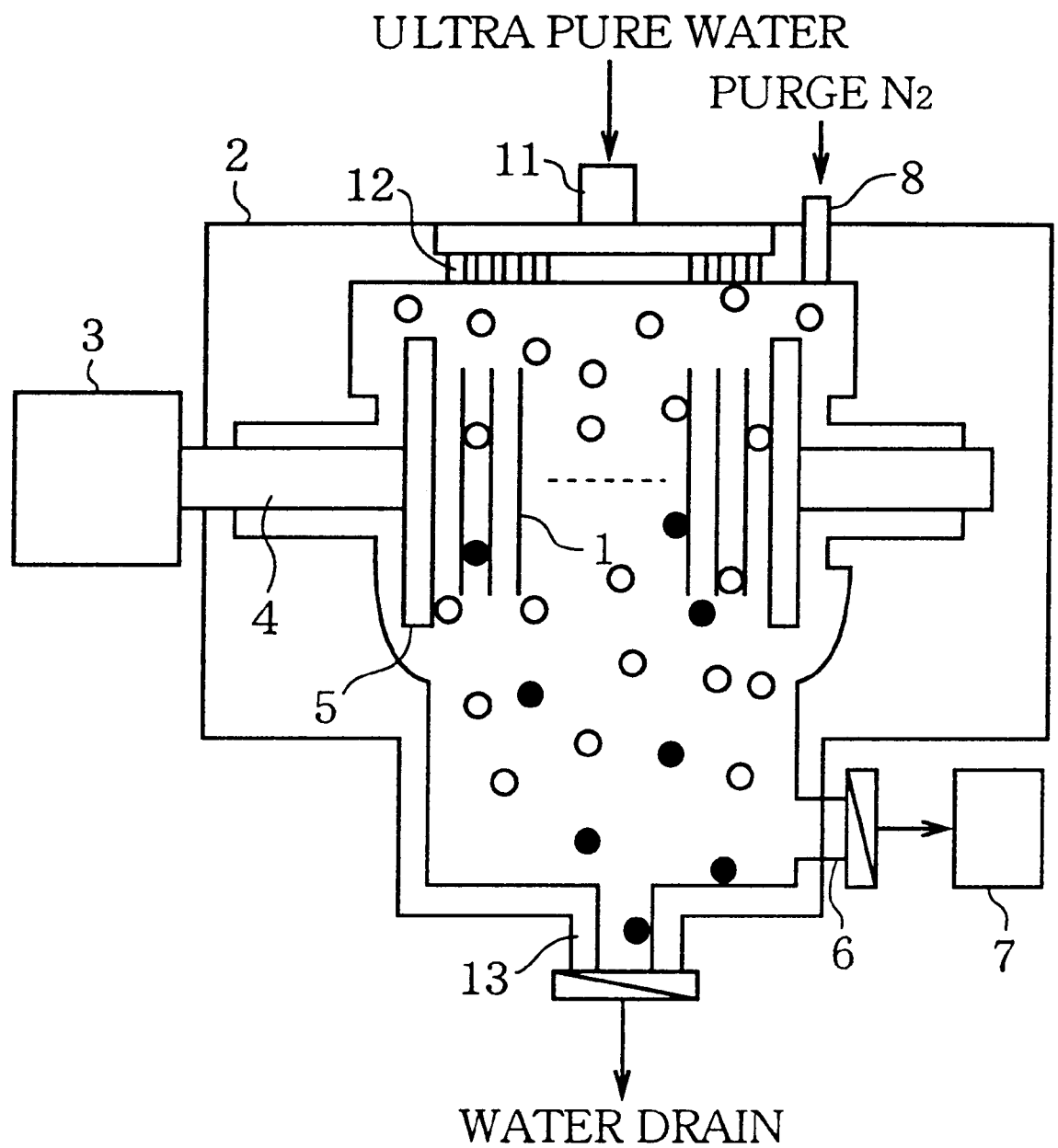
FIG. 5 illustrates, in cross-section, a wafer drying apparatus in accordance with another embodiment of the invention.

FIG. 5 shows in cross-section a silicon wafer dry-cleaning apparatus in accordance with a further embodiment of the present invention. The wafer dryer apparatus shown herein is structurally similar to that shown in FIG. 1 in that the apparatus includes a wafer drying chamber 2, servo motor 3 for use in rotating wafers 1, rotation shaft 4, wafer holder 5, air exhaust duct 6, vacuum pump 7, and purge gas inlet duct 8. Like reference numerals are used to designate like parts or components, and detailed explanation thereof will be eliminated for purposes of convenience in discussion herein.

The wafer dryer equipment of FIG. 5 is designed so that its chamber 2 comes with an ultra-pure water inlet port 11 provided on the top plate of chamber 2 for permitting supplement of ultrapure water to wafers 1 via multiple small openings or holes 12 called the "ultrapure water feed ports" while letting a downflow of such water be escape externally from chamber 2 through a drain port 13 that is formed in the bottom of chamber 2 as shown in FIG. 5.

It has been found through experimentation made by the inventors that whether or not water marks take place on the dried wafer surfaces is determinable depending upon and closely related to elapse of a time as taken from the final rinse treatment up to the wafer dry-cleaning process. The wafers and residual drops of water on their surfaces can expose to the atmospheric air in a cleanroom during transportation of such wafers from a rinse tank at which the final rising treatment is done toward a drying machine where the wafers undergo dry cleaning. In view of this, even where ultrapure water less in dissolved oxygen (DO) has been employed for the rinse treatment at the rinse process step, oxygen inherently contained in the air can be dissolved into water drops adhered to the wafer surfaces during wafer transfer between such IC manufacturing modules, resulting in an increase in DO concentration in such residual water drops. The increase in DO concentration in turn increases the risk of creation of watermarks on wafer surfaces.

One embodiment wafer drying method implementable with the FIG. 5 apparatus is as follows. Firstly, ultrapure water is used to apply rinse treatment to wafers 1, which are then loaded for settlement in the chamber 2 as shown in FIG. 5. Then, the water feed inlet 11 is opened causing ultrapure water to shower down onto wafers 1 to rinse them so that water content residing on the wafer surfaces—namely those water residues high in DO concentration—are washed away. In FIG. 5, empty or "white" circles are used to designate drops of externally supplied ultrapure water less in DO concentration, whereas solid or "black" circles are used to denote those of increased DO concentration for purposes of clarity of illustration only.

During the rise process with ultrapure water, a dried nitrogen purge gas is also fed via a gas inlet duct 8 to the interior of the drying chamber 2. This is to prevent oxygen from dissolving into ultrapure water that is being supplied to target wafers 1 within the chamber 2.

After removal of the "DO-rich" water residues through rinse processes with ultrapure water less in residual oxygen contained therein, the resultant wafers 1 are then subject to rotary dry cleaning for removal of water residues on the silicon wafer surfaces, using low-pressure rotary drying method incorporating the principles of the present invention.

With this embodiment method using the apparatus of FIG. 5, any residual water content on the wafer surfaces must be replaced with ultrapure water inherently less in DO concentration at the stage immediately prior to the dry clean process; thus, it becomes possible to eliminate or minimize creation of water marks thereon otherwise occurring due to such on-wafer water residues during drying.

A wafer dryer apparatus in accordance with a further embodiment of the present invention is shown in FIG. 6A. The apparatus shown is similar in principal structure and operation to that of FIG. 5 with the chamber 2 being modified to be capable of fulfillment with ultrapure water.

One preferable wafer dry clean method implementable using this apparatus is as follows. Prior to the wafer dry process, the chamber 2 acting as the dry vessel is pre-filled with ultrapure water letting silicon wafers 1 be entirely dipped and immersed therein.

Draining this ultrapure water from inside of the chamber 2 permits rinsing of wafers 1 for removal of DO-rich residual water content on the wafer surfaces. Thereafter, the wafers undergo dry cleaning. Or alternatively, these wafers are transferred to inside of chamber 2 as the drying vessel; then, ultrapure water is introduced into the vessel causing wafers 1 be entirely immersed therein.

Thereafter, a "pool" of ultrapure water in the chamber 2 is drained away thus washing out DO-rich water residues on the wafers. The "washed" wafers are then made dry.

An explanation is given of another preferable wafer drying method using the FIG. 5 apparatus in accordance with a yet further embodiment of the present invention with reference to FIGS. 6A–6D.

First, as shown in FIG. 6A, after loading for settlement in the chamber 2 a set of silicon wafers 1 that finished rinsing, a dried nitrogen gas is introduced into the chamber 2 to purge the interior thereof. At this time drops of DO-rich ultrapure water can reside on the wafer surfaces as pictorially indicated by black-circle symbols in FIG. 6A. Thereafter, the water inlet port 14 is opened introducing ultrapure water into the chamber 2 as pictorially shown by while-circle symbols in FIG. 6B, letting wafers 1 be entirely put in the ultrapure water. Then, the ultrapure water is drained out of chamber 2 via the exhaust port 15 to get rid of water residues on the wafer surfaces—i.e. DO-rich water drops (black circles symbols)—through rinsing treatment as shown in FIG. 6C. After having rinsed and removed away such DO-rich water residues, the rotary dry method (low-pressure rotary dry method of the present invention) is used to remove residual water content on the wafer surfaces as shown in FIG. 6D.

In this embodiment also, it is possible to reduce or minimize formation of water marks on the wafers 1 due to the fact that the DO concentration of residual water on the wafer surfaces may be forced to stay lower.

Figure 7:
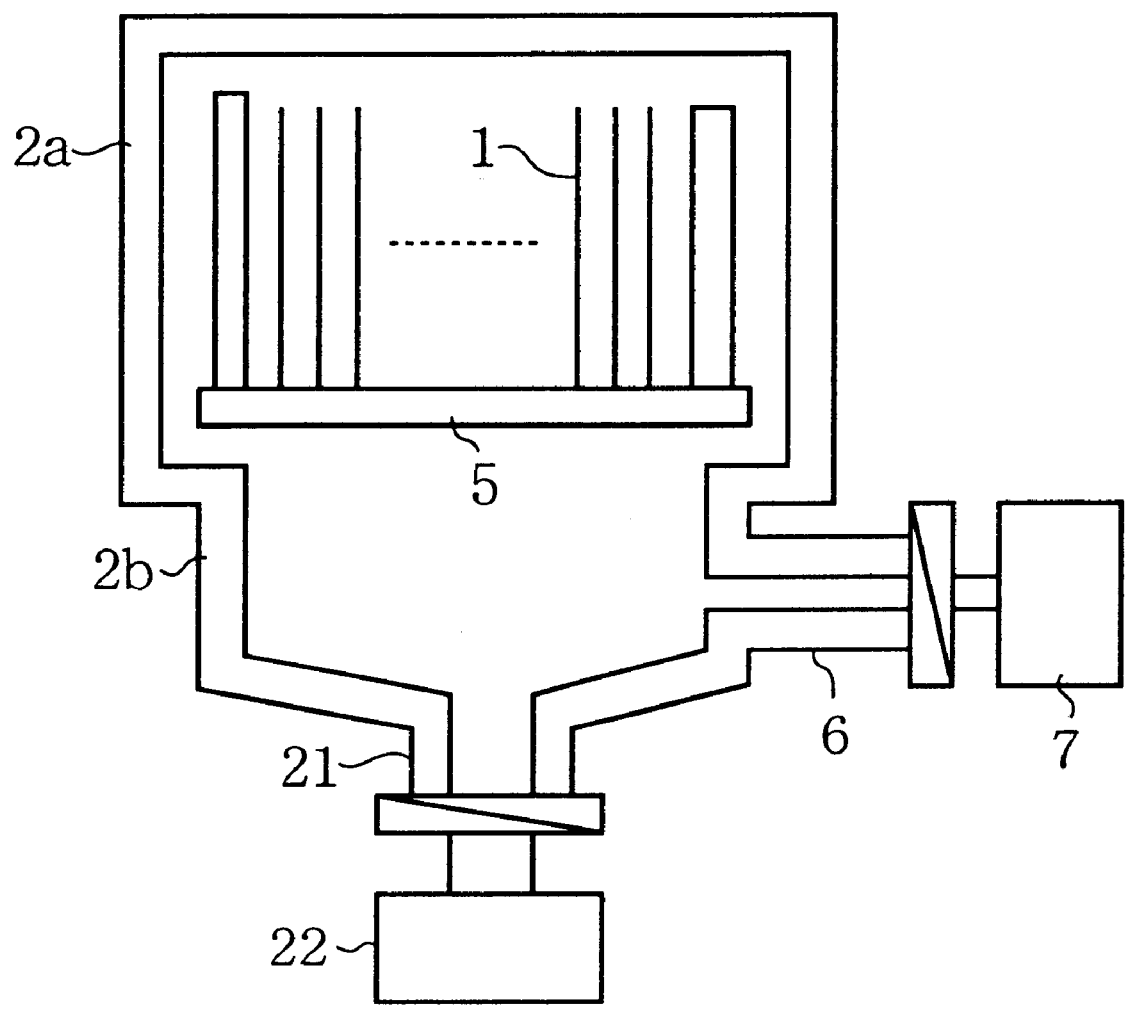
FIG. 7 illustrates, in cross-section, a wafer dryer apparatus in accordance with a third embodiments of the invention.

Referring to FIG. 7, there is shown in schematic cross-section a silicon wafer dry clean apparatus also embodying the present invention. The apparatus shown is structured including a main chamber 2a and a bottom chamber 2b coupled therewith. The main chamber 2a is for receiving therein a holder 5 mounting thereon a set of silicon wafers 1, which are held upstanding side-by-side at equal intervals as shown in FIG. 7. The bottom chamber 2b is connected with main chamber 2a at that bottom, defined as a fat "T"-shaped profile in the internal space of the chamber structure. Bottom chamber 2b has in its sidewall an air exhaust duct 6 coupled thereto. This duct 6 is in turn coupled to an associated vacuum pump 7 for use in effecting forced drainage of the air or gases in the chamber. Bottom chamber 2b also has at its bottom a water drain port 21, which is coupled to a drain pump 22. Upon activation of the drain pump 22, the interior of the chamber structure is vacuum-evacuated letting water residues therein be forcibly removed away to the outside.

A wafer drying method using the apparatus of FIG. 7 is as follows. After having rinsed the silicon wafers 1 by wet clean techniques using pure water or other similar suitable liquids, the resulting wafers 1 are loaded and placed in the main chamber 2a. Most of water drops adhered to the wafer surfaces may fall down due to gravity into the bottom chamber 2b.

After settlement of wafers 1, the vacuum pump 7 is rendered operative evacuating inside of the chamber structure. Simultaneously, the drain pump 22 is activated effecting forced drainage of on-wafer water drops, which are thus removed away. Where appropriate, the vacuum pump 7 and the drain pump 22 may be replaced with a single multifunction pump module as coupled via the drain port 21 to the interior of the chamber structure for simultaneous effectuation of both chamber evacuation and water drainage.

Due to vacuum evacuation the interior of the chamber structure 2a, 2b decrease in pressure down to a low pressure causing wafers 1 to undergo low-pressure dry processing. Optionally, a dry nitrogen purge gas may be additionally fed to inside of the chamber during vacuum evacuation, as in the previously discussed embodiment. Additionally, a little amount of IPA may also be injected into the chamber as necessary.

One significant feature of the wafer dry method using the FIG. 7 apparatus is that the forced air/gas drainage is constantly performed during the low-pressure wafer dry process. This ensures that a minimal amount of water content is left in the main chamber 2a and lower chamber 2b, which in turn enables elimination or suppression of harmful particles due to in-chamber residues while minimizing generation of unwanted water marks on wafers.

Figure 8:
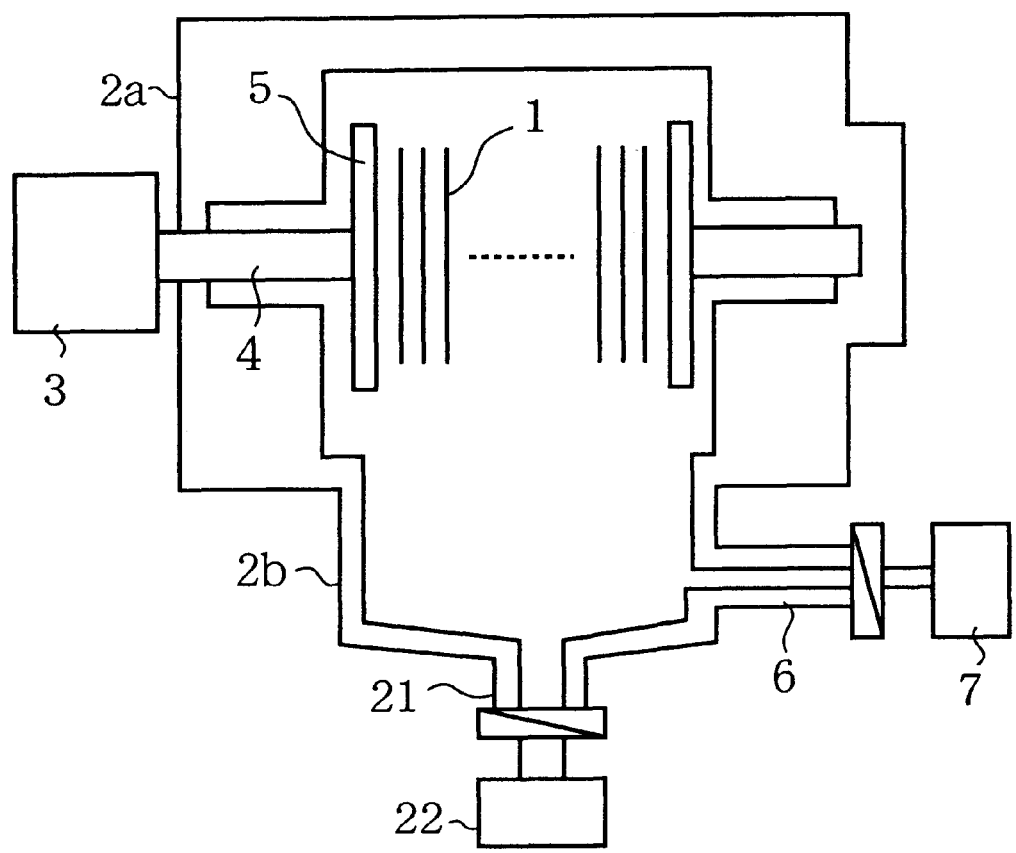
FIG. 8 shows in cross-section a wafer dryer apparatus as one modification of the apparatus of FIG. 7.

A wafer dry clean apparatus shown in FIG. 8 is similar to that of FIG. 7 with the wafer holder 5 being modified to be coupled via a rotation shaft 4 to rotation servo motor 3 thus rotating the wafers 1.

A wafer drying method using the FIG. 8 apparatus is as follows. This method is distinguishable over the prior stated method using the FIG. 7 apparatus in that while the latter is designed so that the silicon wafers 1 are dried at low pressures, the former employs the low-pressure rotary drying scheme to dry the wafers 1 in a way such that the servo motor 3 is activated simultaneously upon starting of vacuum evacuation of the chamber to dry the wafers 1 due to low pressure plus centrifugal force during rotation. With such an arrangement, it becomes possible to speed up the intended wafer dry processes.

In this embodiment also, the forced drainage of water is constantly carried out during the low-pressure rotation dry process. This guarantees that a minimal amount of water content is left in the main chamber 2a and lower chamber 2b, which in turn enables suppression of harmful particles due to in-chamber residues as well as generation of water marks on wafers.

Figure 9A:
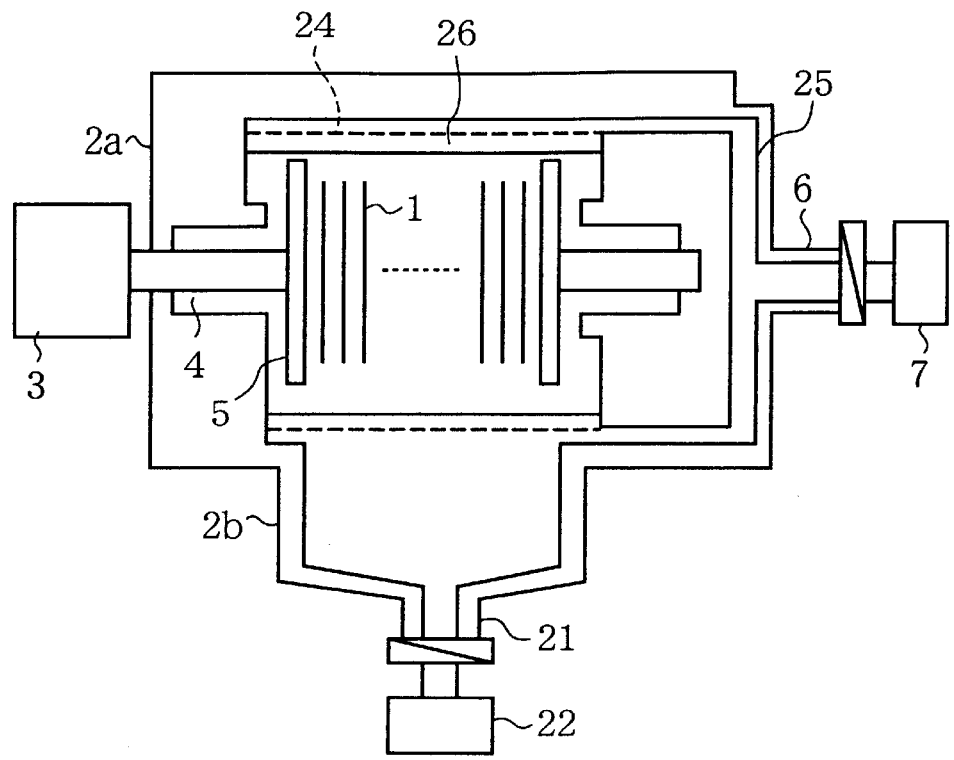
FIG. 9A shows a wafer dryer apparatus in accordance with a forth embodiment of the invention.
Figure 9B:
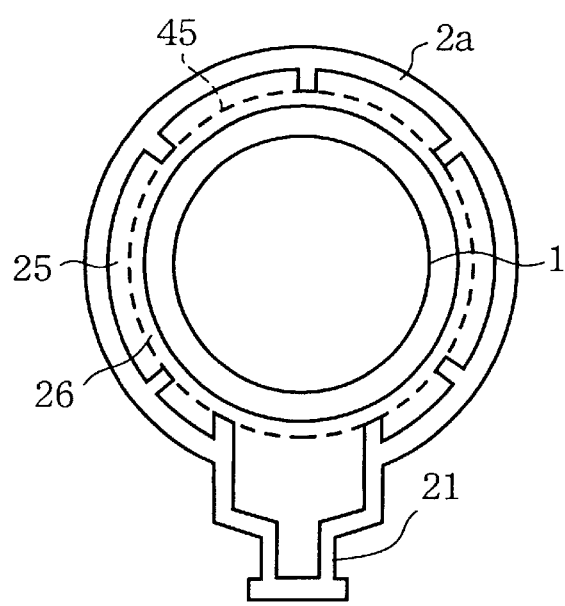
FIG. 9B shows a cross-sectional structure of the FIG. 9A apparatus.

A wafer dry clean apparatus also embodying the invention is shown in FIGS. 9A–9B, which is similar to that of FIG. 8 with the main chamber 2a having a cylindrical inner wall structure 24. This inner drum or "jacket" 24 is placed receiving therein the rotatable wafer holder 5 that holds a set of equally spaced silicon wafers 1 as better shown in FIG. 9A. The cylindrical jacket 24 has its inner wall in which a great number of fine openings or holes 24A are defined over the entire area thereof. Inner jacket 24 is associated with a water absorbable sheet 26 which is in close contact with the inner wall of the jacket 24. Jacket 24 has its outer peripheral surface, which is spaced apart from the top inner wall of main chamber 2a defining a thin space or "gap" therebetween.

The water absorbable sheet 26 may be a cloth-like member made of multicellular or porous materials less in dust productivity, such as for example wipers with enhanced water absorbability for use with currently available in clean-rooms. Optionally, sheet 26 may be a cotton wiper with minimized dust productivity even under vacuum, or alternatively, synthetic fiber wiper including, but not limited to, named "Anticon™" (Milliken Research Corp.).

A wafer dry process using the wafer dryer apparatus shown in FIGS. 9A–9B is as follows. After having rinsed the silicon wafers 1 by wet clean techniques using pure water or equivalent liquids thereto, resultant wafers 1 are loaded and settled on the holder 5 as placed within the inner jacket 24 in main chamber 2a. Then, the servo motor 3 is rendered operative rotating the holder 5 and in turn the wafers mounted thereon at high speeds. This high-speed wafer rotation lets water residues on wafer surfaces centrifugally spin off therefrom so that wafers 1 is made dry during rotating. Water drops centrifugally dispersed from wafers 1 impact the water absorption sheet 25 to be absorbed therein. Simultaneously, due to vacuum evacuation by the pumps 7 and 22, the absorbed water content is forced to further progress or "outdiffuse" through small holes 24A of jacket 24 into the narrow space defined between the outer periphery of jacket 24 and the inner wall of main chamber 2a; finally, such water drops down to the lower chamber 2b and then is sucked by pump 22 for external drainage. Some of such water resides within the chamber in form of mist, which is also removed away by pump 7 through duct 6. Optionally, a dried nitrogen purge gas may be additionally fed into the chamber after settlement of wafers 1 therein, as in previous embodiments stated supra.

The methodology implementable with the FIGS. 9A–9B apparatus is arranged to employ the water absorption sheet 26 for absorbing water drops as centrifugally spun off from wafers 1 while at the same time removing those water drops falling down via multiple microholes 24A of inner jacket 24. This in turn makes it possible to eliminate, or at least greatly suppress, generation of mist otherwise occurring due to collision of water drops with the chamber's inner walls. It is also possible to prevent particles of such mist from attempting to adhere to the wafer surfaces. Another advantage of this method is that since the chamber inside space is kept at low pressures during wafer dry processes, any water content once absorbed in jacket sheet 26 may be rapidly released outwardly through microholes 24A, thereby allowing sheet 26 to be "refreshed" offering maximized water absorbability in any events. Even where sheet 26 can exhibit certain dust generation, such dust is forced to immediately escape via jacket microholes 24A toward outside of the chamber. This may ensure that dust is no longer adhered to wafers 1. A still further advantage lies in that the "mist suppression" feature avoids the need for increment of the distance between wafers 1 and the chamber's inner wall, which in turn attain an ability to scale down the wafer dryer apparatus.

While the present invention has been particularly shown and described with reference to the preferred embodiments, it will be understood by those skilled in the art that various changes in form and detail may be made without departing from the spirit, scope, and teaching of the invention. Accordingly, the disclosed invention is to be considered merely as illustrative and limited in scope of coverage only as specified in the appended claims.

What is claimed is:

1. A wafer drying apparatus comprising:

a drying vessel;

a wafer holder mounted in said drying vessel;

a rotator device for rotating said wafer holder;

an evacuation device for evacuating gas inside of said drying vessel; and a cloth set around said wafer holder.

2. The wafer drying apparatus set forth in claim 1, further comprising a water drain device for drainage of residual water content from the wafer.

3. The apparatus set forth in claim 2, wherein said cloth is a wiper comprised of synthetic fiber.

4. A wafer drying apparatus comprising:

a drying vessel;

a wafer holder mounted in said drying vessel;

a rotator device for rotating said wafer holder;

an evacuation device for evacuating gas inside of said drying vessel;

an inner wall member having a plurality of openings placed between said drying vessel and said wafer holder to cover those locations near and around said wafer holder, being located from said drying vessel; and a cloth set around said wafer holder.

5. The wafer drying apparatus set forth in claim 4, further comprising a water drain device for drainage of residual water content from the wafer.

6. The apparatus set forth in claim 5, wherein said cloth is a wiper comprised of synthetic fiber.

* * * * *